(12) United States Patent
Noh

(10) Patent No.: US 11,600,537 B2
(45) Date of Patent: *Mar. 7, 2023

(54) MAGNETIC PROPERTY MEASURING SYSTEM, A METHOD FOR MEASURING MAGNETIC PROPERTIES, AND A METHOD FOR MANUFACTURING A MAGNETIC MEMORY DEVICE USING THE SAME

(71) Applicant: Samsung Electronics Co., Ltd., Suwon-si (KR)

(72) Inventor: Eunsun Noh, Yongin-si (KR)

(73) Assignee: Samsung Electronics Co., Ltd.

( * ) Notice: Subject to any disclaimer, the term of this patent is extended or adjusted under 35 U.S.C. 154(b) by 121 days.

This patent is subject to a terminal disclaimer.

(21) Appl. No.: 17/116,462

(22) Filed: Dec. 9, 2020

(65) Prior Publication Data

US 2021/0118753 A1 Apr. 22, 2021

Related U.S. Application Data

(63) Continuation of application No. 16/411,680, filed on May 14, 2019, now Pat. No. 10,892,196.

(30) Foreign Application Priority Data

Oct. 22, 2018 (KR) ........................ 10-2018-0125889

(51) Int. Cl.
*H01L 43/12* (2006.01)
*H01L 21/66* (2006.01)
(Continued)

(52) U.S. Cl.
CPC .......... *H01L 22/14* (2013.01); *G01R 33/0325* (2013.01); *G01R 33/1207* (2013.01);
(Continued)

(58) Field of Classification Search
CPC ................. H01L 22/14; H01L 21/6838; H01L 27/228; H01L 43/02; H01L 43/12; H01L 22/12; H01L 43/08; G01R 33/0325; G01R 33/1207; G01R 33/0052; G01R 33/098; G01R 33/1253; G01R 33/14; H01F 10/3254; H01F 10/3286; H01F 41/34;
(Continued)

(56) References Cited

U.S. PATENT DOCUMENTS 5,493,220 A 2/1996 Oliver et al.
5,736,856 A 4/1998 Oliver et al.
5,822,063 A 10/1998 Suzuki et al.
(Continued)

FOREIGN PATENT DOCUMENTS

JP H10177063 6/1998
JP 2010203989 9/2010

*Primary Examiner* — Thanh T Nguyen
(74) *Attorney, Agent, or Firm* — Myers Bigel, P.A.

(57) ABSTRACT

A magnetic property measuring system includes a stage configured to hold a sample and a magnetic structure disposed over the stage. The stage includes a body part, a magnetic part adjacent the body part, and a plurality of holes defined in the body part. The magnetic part of the stage and the magnetic structure are configured to apply a magnetic field, which is perpendicular to one surface of the sample, to the sample. The stage is configured to move horizontally in an x-direction and a y-direction which are parallel to the one surface of the sample.

10 Claims, 20 Drawing Sheets

(51) Int. Cl.
*H01F 41/34* (2006.01)
*H01L 21/683* (2006.01)
*G01R 33/032* (2006.01)
*H01F 10/32* (2006.01)
*H01L 27/22* (2006.01)
*G01R 33/12* (2006.01)
*H01L 43/02* (2006.01)

(52) U.S. Cl.
CPC ..... *H01F 10/3254* (2013.01); *H01F 10/3286* (2013.01); *H01F 41/34* (2013.01); *H01L 21/6838* (2013.01); *H01L 27/228* (2013.01); *H01L 43/02* (2013.01); *H01L 43/12* (2013.01)

(58) Field of Classification Search
CPC ........... G01N 21/47; G01N 2021/4792; G01N 27/72; G11C 11/161; G11C 2211/5615
See application file for complete search history.

(56) References Cited

U.S. PATENT DOCUMENTS

| | | |
|---|---|---|
| 6,528,993 B1 | 3/2003 | Shin et al. |
| 9,348,000 B1 | 5/2016 | Pressesky et al. |
| 10,892,196 B2 * | 1/2021 | Noh .................. G01R 33/1207 |
| 2002/0029459 A1 | 3/2002 | Yoshida et al. |
| 2002/0097640 A1 * | 7/2002 | Seo ........................ B82Y 10/00 |
| 2013/0066597 A1 | 3/2013 | Van |
| 2015/0247821 A1 | 9/2015 | Enpuku et al. |
| 2016/0033548 A1 * | 2/2016 | Zhang .................... G01Q 20/02 |
| | | 850/6 |
| 2017/0034456 A1 | 2/2017 | Kyung et al. |
| 2019/0295616 A1 | 9/2019 | Noh et al. |

\* cited by examiner

MAGNETIC PROPERTY MEASURING SYSTEM, A METHOD FOR MEASURING MAGNETIC PROPERTIES, AND A METHOD FOR MANUFACTURING A MAGNETIC MEMORY DEVICE USING THE SAME

CROSS-REFERENCE TO RELATED APPLICATION

This application is a continuation application of U.S. patent application Ser. No. 16/411,680, filed May 14, 2019, which patent application claims priority under 35 U.S.C. § 119 to Korean Patent Application No. 10-2018-0125889, filed on Oct. 22, 2018, in the Korean Intellectual Property Office, the disclosure of which is hereby incorporated by reference in its entirety.

BACKGROUND

Embodiments of the inventive concepts relate to a magnetic property measuring system, a method for measuring magnetic properties, and a method for manufacturing a magnetic memory device using the same. More particularly, embodiments of the inventive concepts relate to a system and a method for measuring magnetic properties of a magnetic tunnel junction by using a magneto-optical Kerr effect (MOKE), and a method for manufacturing a magnetic memory device using the same.

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, when the magnetization directions of the two magnetic layers are anti-parallel or not parallel to each other, the magnetic tunnel junction pattern may have a relatively high resistance value. When the magnetization directions of the two magnetic layers are parallel to each other, the magnetic tunnel junction pattern may have a relatively low resistance value. The magnetic memory device may read/write data using a difference between the resistance values of the magnetic tunnel junction pattern.

When the magnetization directions of the two magnetic layers are substantially perpendicular to an interface between the insulating layer and the magnetic layer, the magnetic tunnel junction pattern may be defined as a perpendicular magnetic tunnel junction pattern. A measuring system using a polar magneto-optical Kerr effect (polar MOKE) may be used to measure perpendicular magnetic properties of the perpendicular magnetic tunnel junction pattern.

SUMMARY

Embodiments of the inventive concepts may provide magnetic property measuring system and method capable of measuring effective magnetic properties of magnetic tunnel junction patterns on various regions of a sample.

Embodiments of the inventive concepts may also provide magnetic property measuring system and method capable of stably measuring magnetic properties of a magnetic tunnel junction pattern.

Embodiments of the inventive concepts may further provide a method for manufacturing a magnetic memory device, which is capable of improving mass production and quality stability.

In an aspect, a magnetic property measuring system may include a stage configured to hold a sample and a magnetic structure disposed over the stage. The stage may include a body part, a magnetic part adjacent the body part, and a plurality of holes defined in the body part. The magnetic part of the stage and the magnetic structure may be configured to apply a magnetic field, which is perpendicular to one surface of the sample, to the sample. The stage may be configured to move horizontally in an x-direction and a y-direction which are parallel to the one surface of the sample.

In an aspect, a method for measuring magnetic properties may include loading a sample on a stage, fixing the sample on the stage by using a vacuum, moving a measurement target region of the sample to a light irradiation region by moving the stage horizontally in an x-direction and a y-direction which are parallel to a top surface of the sample, irradiating incident light to the measurement target region of the sample, and detecting polarization of light reflected from the measurement target region of the sample.

In an aspect, a method for manufacturing a magnetic memory device may include forming a magnetic tunnel junction layer on a substrate, patterning the magnetic tunnel junction layer to form magnetic tunnel junction patterns, measuring magnetic properties of the magnetic tunnel junction patterns, and determining whether the measured magnetic properties are in an allowable range. The measuring the magnetic properties of the magnetic tunnel junction patterns may include loading the substrate on a stage in a magnetic property measuring system, fixing the substrate on the stage by using a vacuum, moving a measurement target region of the substrate to a light irradiation region by moving the stage horizontally in an x-direction and a y-direction which are parallel to a top surface of the substrate, irradiating incident light to the measurement target region of the substrate, and detecting polarization of light reflected from the measurement target region of the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in detail with reference to the accompanying drawings. As used herein the expression "and/or" includes any and all combinations of one or more of the associated listed items.

Figure 1:
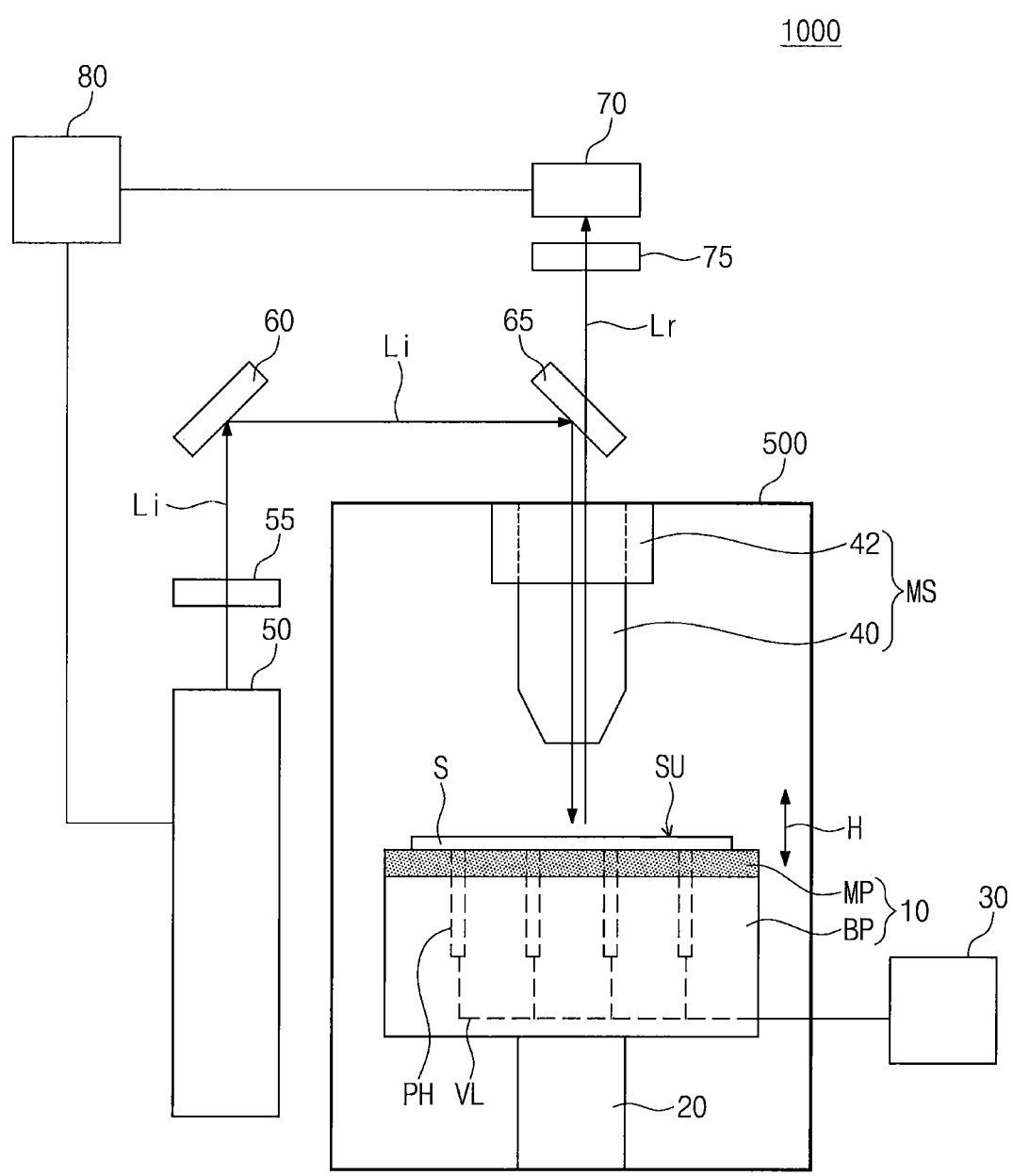
FIG. 1 is a conceptual view illustrating a magnetic property measuring system according to some embodiments of the inventive concepts.
Figure 2:
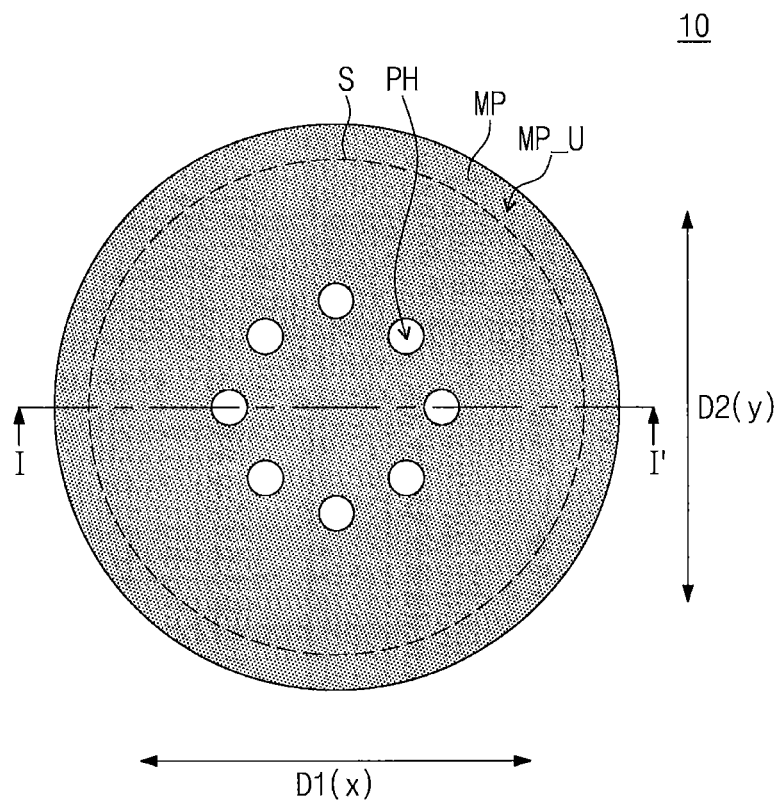
FIG. 2 is a plan view illustrating a stage of FIG. 1.
Figure 3:
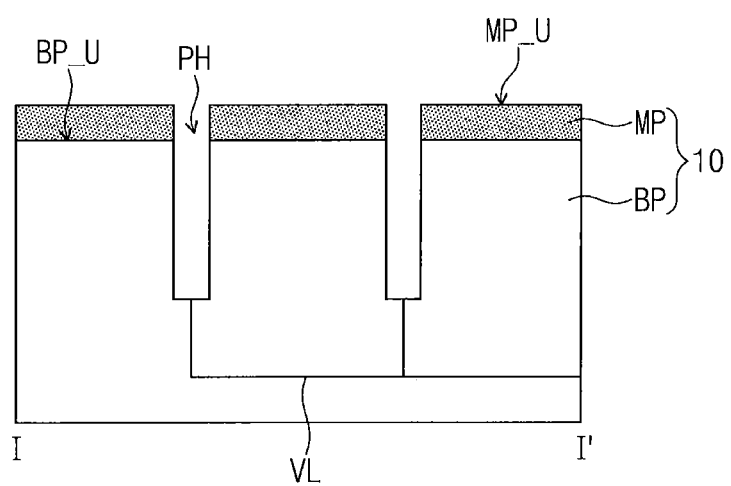
FIG. 3 is a cross-sectional view taken along a line I-I' of FIG. 2.
Figure 4:
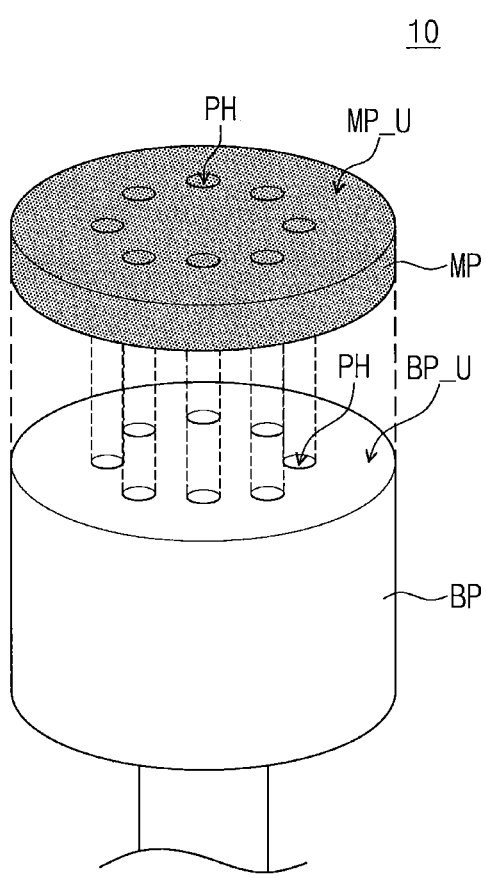
FIG. 4 is an exploded perspective view illustrating the stage of FIG. 1.

FIG. 1 is a conceptual view illustrating a magnetic property measuring system according to some embodiments of the inventive concepts. FIG. 2 is a plan view illustrating a stage of FIG. 1, and FIG. 3 is a cross-sectional view taken along a line I-I' of FIG. 2. FIG. 4 is an exploded perspective view illustrating the stage of FIG. 1.

Referring to FIG. 1, a magnetic property measuring system 1000 may include a chamber 500 configured to receive a sample S therein, a stage 10 provided in the chamber 500 and configured to load or hold the sample S, a support member 20 for supporting the stage 10, a magnetic structure MS disposed over the stage 10 in the chamber 500, a light source 50 configured to emit incident light Li, and a detector 70 configured to receive reflected light Lr reflected from the sample S. The magnetic property measuring system 1000 may further include a polarizer 55 for polarizing the incident light Li emitted from the light source 50, a first optical member 60 and a second optical member 65 for controlling a light path of the incident light Li, and an analyzer 75 for polarizing the reflected light Lr. The incident light Li may be polarized by the polarizer 55, and the polarized incident light Li may be reflected by the first optical member 60 and the second optical member 65 and then may be irradiated to a top or upper surface SU of the sample S. The reflected light Lr may be polarized by the analyzer 75, and the polarized reflected light Lr may be received at or by the detector 70. A polarization axis of the polarizer 55 may be perpendicular to a polarization axis of the analyzer 75.

The stage 10 may include a body part BP and a magnetic part MP adjacent the body part BP. The magnetic part MP may include, for example, a magnetic material. The magnetic structure MS may include a pole piece 40 and a coil 42 surrounding an outer circumferential surface of the pole piece 40. The pole piece 40 may include, for example, a magnetic material. The magnetic part MP of the stage 10 and the magnetic structure MS may be configured to apply a magnetic field H, which is substantially perpendicular to the top surface SU of the sample S, to the sample S.

The stage 10 may further include a plurality of holes PH defined in or disposed in the body part BP and/or the magnetic part MP. Each of the plurality of holes PH may be connected to a vacuum line VL disposed in the body part BP. The magnetic property measuring system 1000 may further include a vacuum pump 30 connected to the vacuum line VL.

Referring to FIGS. 2 to 4, according to some embodiments, the magnetic part MP may be disposed on (e.g., directly on) the body part BP. For example, the magnetic part MP may be a coating layer coated on a top or upper surface BP_U of the body part BP. The plurality of holes PH may extend into the magnetic part MP and may penetrate the magnetic part MP. In some embodiments, the plurality of holes PH may be disposed adjacent a center of the sample S and may be disposed to surround the center of the sample S, when viewed in a plan view. For example, the plurality of holes PH may be arranged in an imaginary circular form surrounding the center of the sample S when viewed in a plan view. However, according to certain embodiments of the inventive concepts, the number, sizes, shapes and/or arrangement of the plurality of holes PH may be variously modified as described below with reference to FIGS. 5A to 5D. In some embodiments, the sample S may be placed on a top or upper surface MP_U of the magnetic part MP of the stage 10.

The stage 10 may be configured to fix the sample S on the stage 10 by using a vacuum. The stage 10 may fix the sample S on the stage 10 by drawing or sucking air through the plurality of holes PH. For example, each of the plurality of holes PH may be connected to the vacuum line VL, and the vacuum line VL may be connected to the vacuum pump 30 of FIG. 1. When the vacuum pump 30 operates, air in a space between the sample S and the stage 10 may be drawn or sucked through the plurality of holes PH and the vacuum line VL. Thus, the sample S may be pulled to a surface of the stage 10 (e.g., the top surface MP_U of the magnetic part MP) and may be fixed on the surface of the stage 10 (e.g., the top surface MP_U of the magnetic part MP).

The stage 10 may be configured to move horizontally in a first direction D1 and a second direction D2 which are parallel to the top surface SU of the sample S. The first direction D1 and the second direction D2 may intersect each other. For example, the first direction D1 and the second direction D2 may be perpendicular to each other and may correspond to an x-direction and a y-direction, respectively. For example, the stage 10 may be an X-Y stage having a repeat positioning accuracy of 100 nm or less.

Referring again to FIG. 1, the light source 50 may be a laser light source. The light source 50 may be used as a single light source of the magnetic property measuring system 1000. The incident light Li polarized by the polarizer 55 may be reflected by the first optical member 60 and the second optical member 65 and then may be irradiated to the sample S. The incident light Li may be irradiated perpendicularly to the top surface SU of the sample S. However, embodiments of the inventive concepts are not limited thereto. In certain embodiments, the incident light Li may be irradiated obliquely to the top surface SU of the sample S.

The detector 70 may detect polarization of the reflected light Lr reflected from the sample S. The reflected light Lr may pass through the second optical member 65 so as to be guided to the analyzer 75 and may be polarized by the analyzer 75. The polarized reflected light Lr may be received at or by the detector 70.

The magnetic property measuring system 1000 may further include a controller 80 connected or operatively connected to the light source 50 and the detector 70. The controller 80 may process data obtained from the detector 70. The controller 80 may process, store and/or display the data, obtained from the detector 70, in various forms (e.g., numerical values, a graph and/or an image). Even though not shown in the drawings, the controller 80 may be connected or operatively connected to the stage 10 and may control operations of the stage 10.

The magnetic property measuring system 1000 may be configured to measure perpendicular magnetic properties of the sample S by using a polar magneto-optical Kerr effect (polar MOKE). A magneto-optical Kerr effect (MOKE) means a phenomenon in which polarization of light is changed when the light is reflected from a magnetic object. The polar MOKE means a case in which a magnetized direction of the object is perpendicular to a surface of the object and is parallel to a plane in which light is incident and reflected (i.e., a plane of incidence). The magnetic property measuring system 1000 may be a polar MOKE measuring system and may measure a degree of perpendicular magnetization of a surface of the sample S by analyzing polarization of light (i.e., the reflected light Lr) which is reflected from the top surface SU of the sample S. For example, the detector 70 may detect polarization of the reflected light Lr, and the controller 80 may generate a magnetic hysteresis curve for the surface of the sample S on the basis of data obtained from the detector 70.

FIGS. 5A to 5D are plan views illustrating various modified examples of the stage of FIG. 1.

Figure 5A:
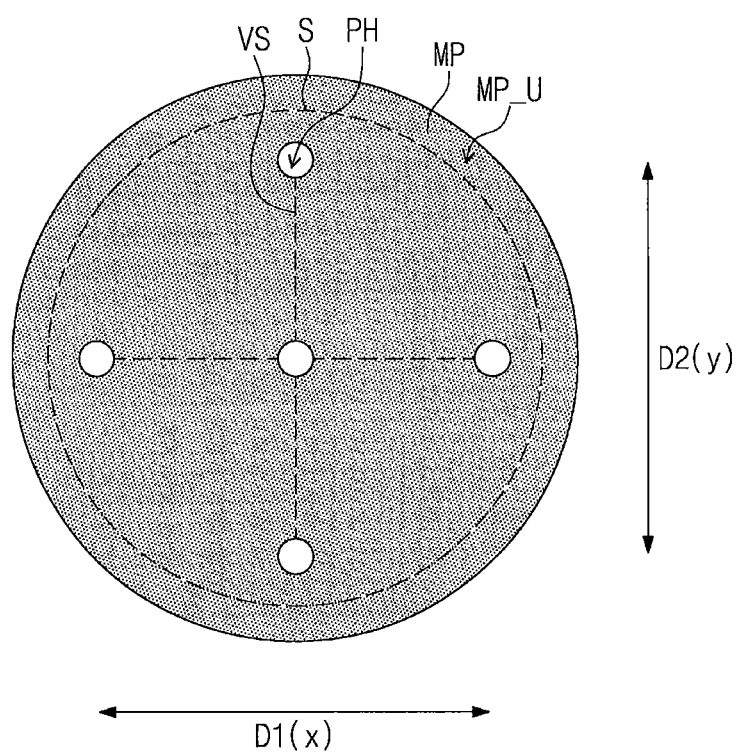
FIGS. 5A to 5D are plan views illustrating various modified examples of the stage of FIG. 1.

Referring to FIG. 5A, according to a modified example, the plurality of holes PH may be arranged in an imaginary cross form passing through the center of the sample S when viewed in a plan view. For example, one of the plurality of holes PH may be disposed at the center of the sample S when viewed in a plan view. At least one pair of holes PH among the plurality of holes PH may be spaced apart from each other in the first direction D1 with the one hole PH (e.g., center hole) interposed therebetween, and at least another pair of holes PH among the plurality of holes PH may be spaced apart from each other in the second direction D2 with the one hole PH (e.g., center hole) interposed therebetween.

Figure 5B:
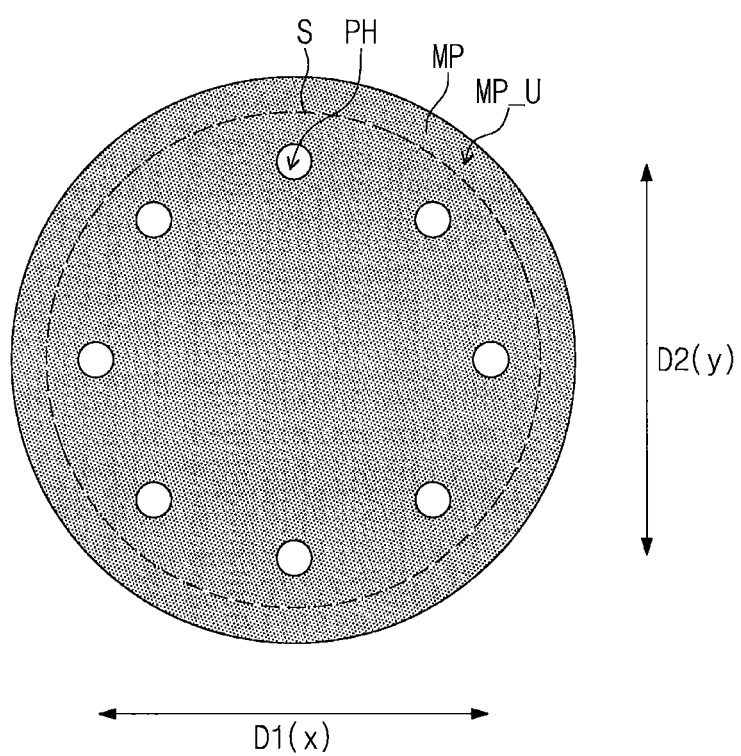
Figure 5C:
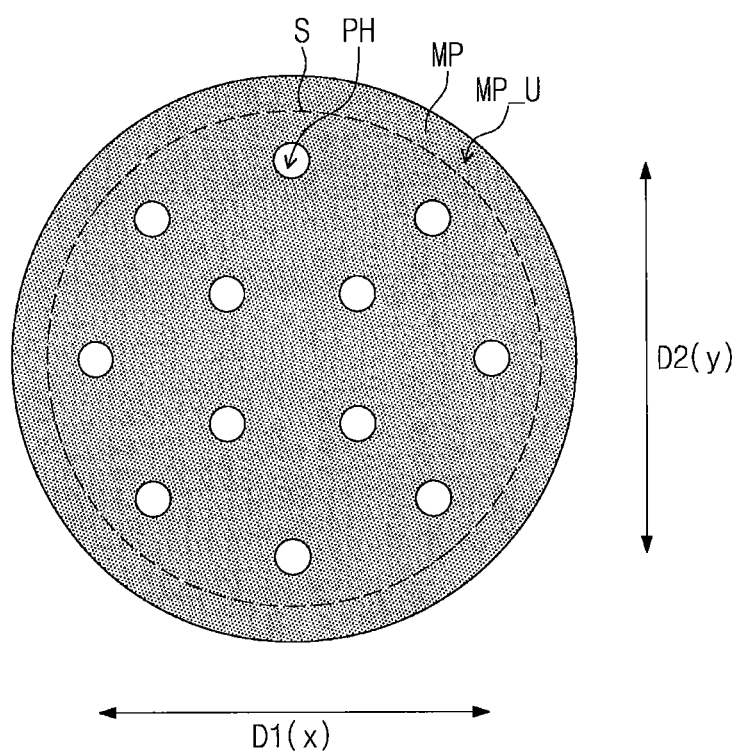
Figure 5D:
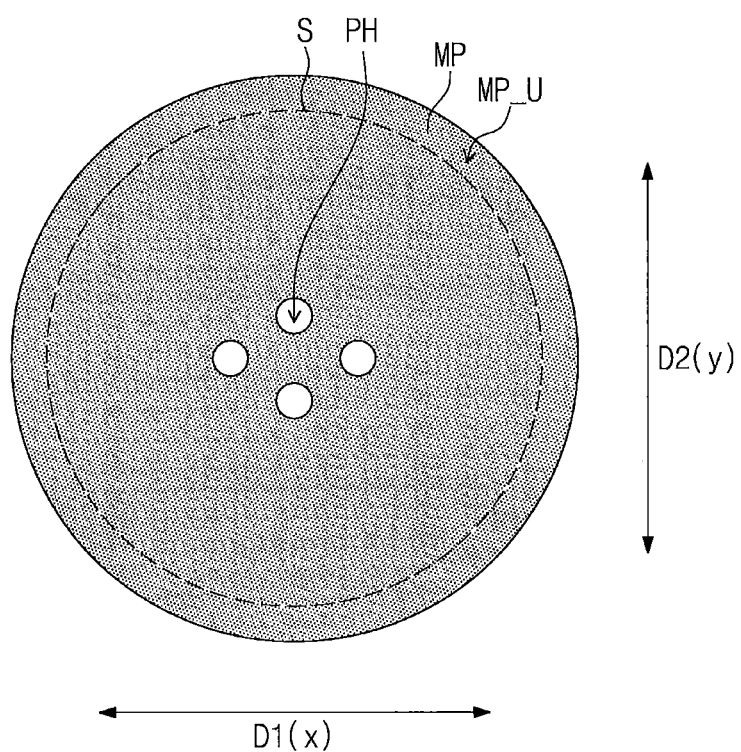

Referring to FIG. 5B, according to a modified example, the plurality of holes PH may be disposed adjacent an edge of the sample S and may be arranged along an outer circumferential surface or outer circumferential portion of the sample S, when viewed in a plan view. Referring to FIG. 5C, according to a modified example, the plurality of holes PH may be uniformly distributed in a region overlapping with the entirety or whole of the top surface SU of the sample S when viewed in a plan view. Referring to FIG. 5D, according to a modified example, the plurality of holes PH may be disposed adjacent the center of the sample S and may be arranged to surround the center of the sample S, when viewed in a plan view. For example, the plurality of holes PH may be arranged in an imaginary elliptical form surrounding the center of the sample S when viewed in a plan view. However, according to certain embodiments of the inventive concepts, the number, sizes, shapes and/or arrangement of the plurality of holes PH are not limited to the illustrated embodiments but may be variously modified.

Figure 6:
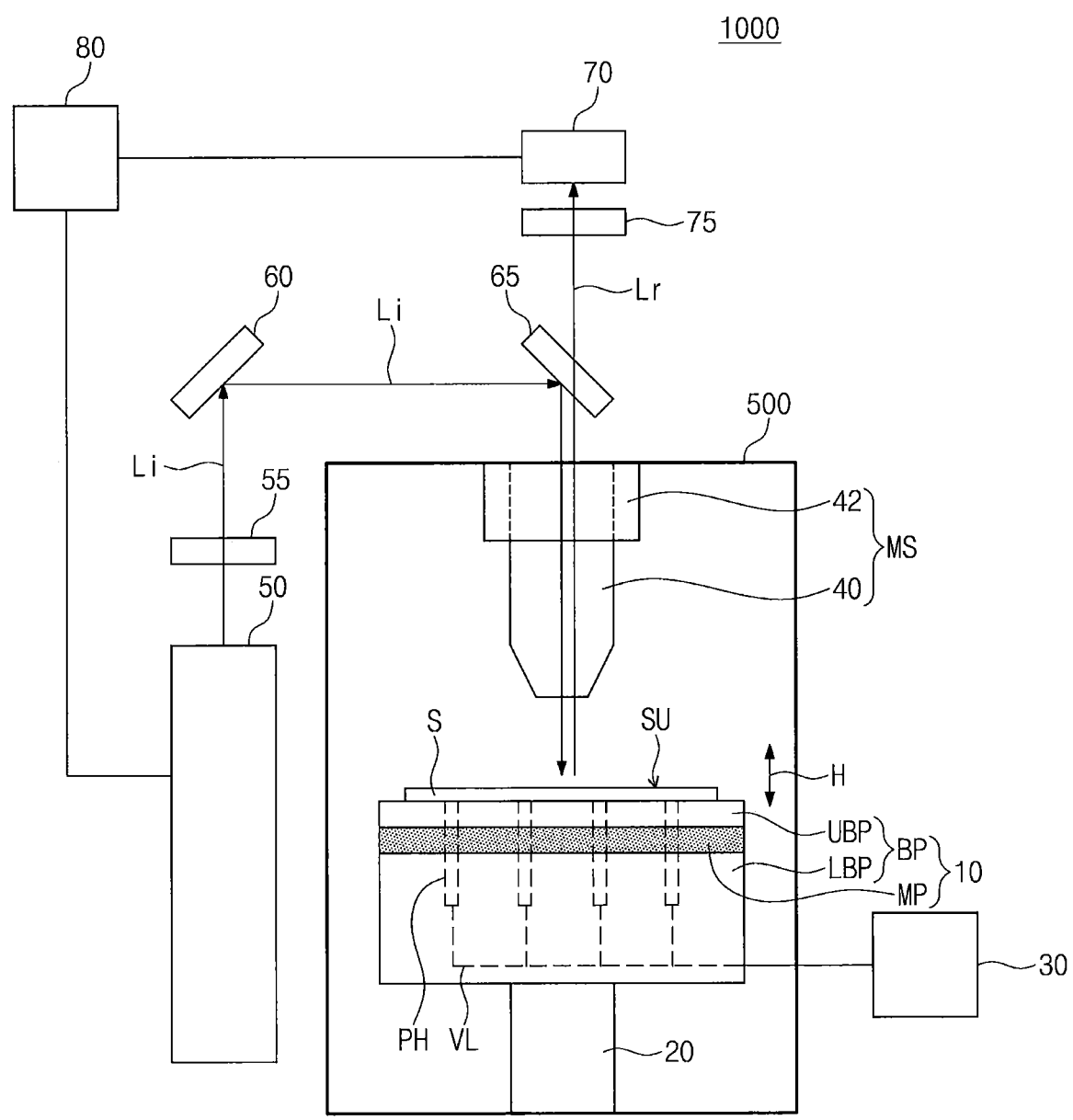
FIG. 6 is a conceptual view illustrating a magnetic property measuring system according to some embodiments of the inventive concepts.
Figure 7:
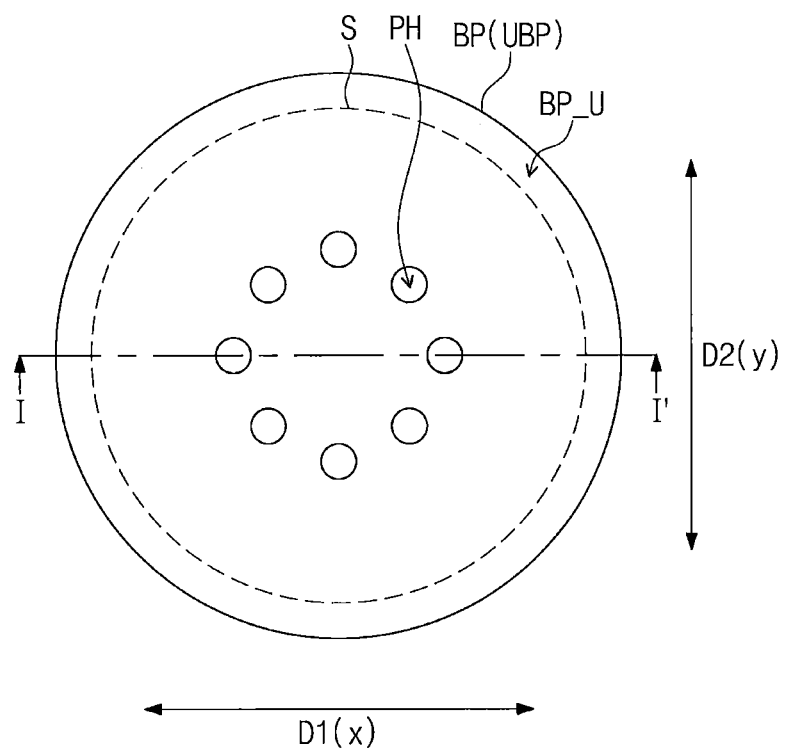
FIG. 7 is a plan view illustrating a stage of FIG. 6.
Figure 8:
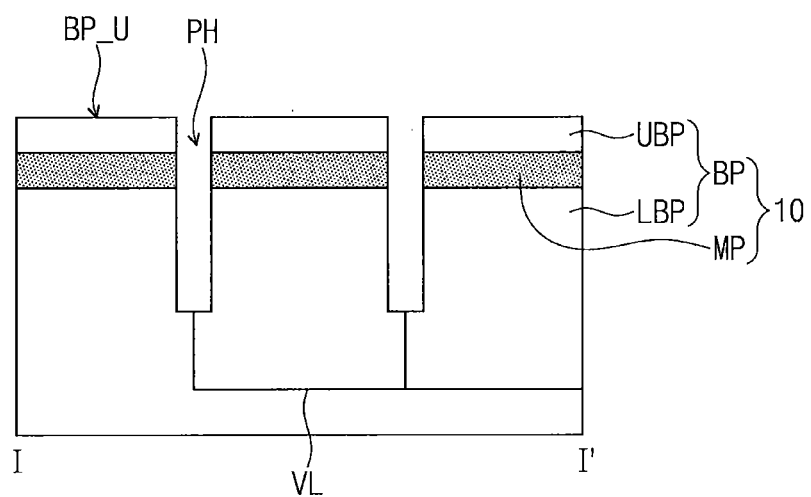
FIG. 8 is a cross-sectional view taken along a line I-I' of FIG. 7.
Figure 9:
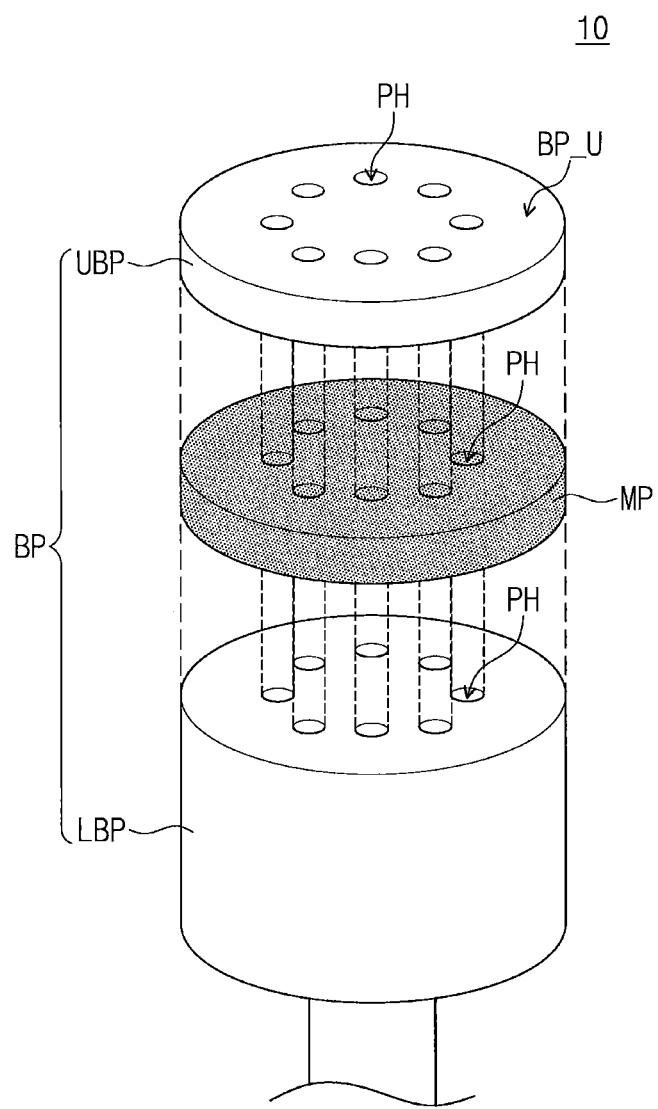
FIG. 9 is an exploded perspective view illustrating the stage of FIG. 6.

FIG. 6 is a conceptual view illustrating a magnetic property measuring system according to some embodiments of the inventive concepts. FIG. 7 is a plan view illustrating a stage of FIG. 6, and FIG. 8 is a cross-sectional view taken along a line I-I' of FIG. 7. FIG. 9 is an exploded perspective view illustrating the stage of FIG. 6. Hereinafter, differences between the present embodiments and the embodiments of FIGS. 1 to 4 and 5A to 5D will be mainly described for the purpose of ease and convenience in explanation.

Referring to FIG. 6, the stage 10 may include a body part BP and a magnetic part MP adjacent the body part BP. The magnetic part MP may include, for example, a magnetic material. The magnetic part MP of the stage 10 and the magnetic structure MS may be configured to apply the magnetic field H, which is substantially perpendicular to the top surface SU of the sample S, to the sample S. According to the present embodiments, the magnetic part MP may be disposed in the body part BP. The body part BP may include an upper body part UBP and a lower body part LBP, and the magnetic part MP may be disposed between the upper body part UBP and the lower body part LBP. The upper body part UBP may be directly on the magnetic part MP and/or the magnetic part MP may be directly on the lower body part LBP. The stage 10 may further include a plurality of holes PH defined in or disposed in the body part BP and/or the magnetic part MP. Each of the plurality of holes PH may be connected to the vacuum line VL disposed in the body part BP.

Referring to FIGS. 7 to 9, the plurality of holes PH may be disposed in the lower body part LBP, and each of the plurality of holes PH may be connected to the vacuum line VL disposed in the lower body part LBP. The plurality of holes PH may extend into the magnetic part MP and the upper body part UBP and may penetrate the magnetic part MP and the upper body part UBP. The number, sizes, shapes and/or arrangement of the plurality of holes PH may be variously modified as described above with reference to FIGS. 5A to 5D. The stage 10 may be configured such that the sample S is placed on a top or upper surface BP_U of the body part BP (i.e., a top or upper surface of the upper body part UBP).

The stage 10 may be configured to fix the sample S on the stage 10 by using a vacuum. The stage 10 may fix the sample S on the stage 10 by drawing or sucking air through the plurality of holes PH. For example, each of the plurality of holes PH may be connected to the vacuum line VL, and the vacuum line VL may be connected to the vacuum pump 30 of FIG. 6. When the vacuum pump 30 operates, air in a space between the sample S and the stage 10 may be drawn or sucked through the plurality of holes PH and the vacuum line VL. Thus, the sample S may be pulled to a surface of the stage 10 (e.g., the top surface BP_U of the body part BP) and may be fixed on the surface of the stage 10 (e.g., the top surface BP_U of the body part BP).

The stage 10 may be configured to move horizontally in the first direction D1 and the second direction D2 which are parallel to the top surface SU of the sample S. The first direction D1 and the second direction D2 may intersect each other. For example, the first direction D1 and the second direction D2 may be perpendicular to each other and may correspond to an x-direction and a y-direction, respectively. For example, the stage 10 may be an X-Y stage having a repeat positioning accuracy of 100 nm or less.

Except for the differences described above, other components and/or features of the magnetic property measuring system 1000 according to the present embodiments may be substantially the same as corresponding components and/or features of the magnetic property measuring system 1000 described with reference to FIGS. 1 to 4 and 5A to 5D.

A method for measuring magnetic properties using the magnetic property measuring system 1000 according to embodiments of the inventive concepts will be described hereinafter.

Figure 10:
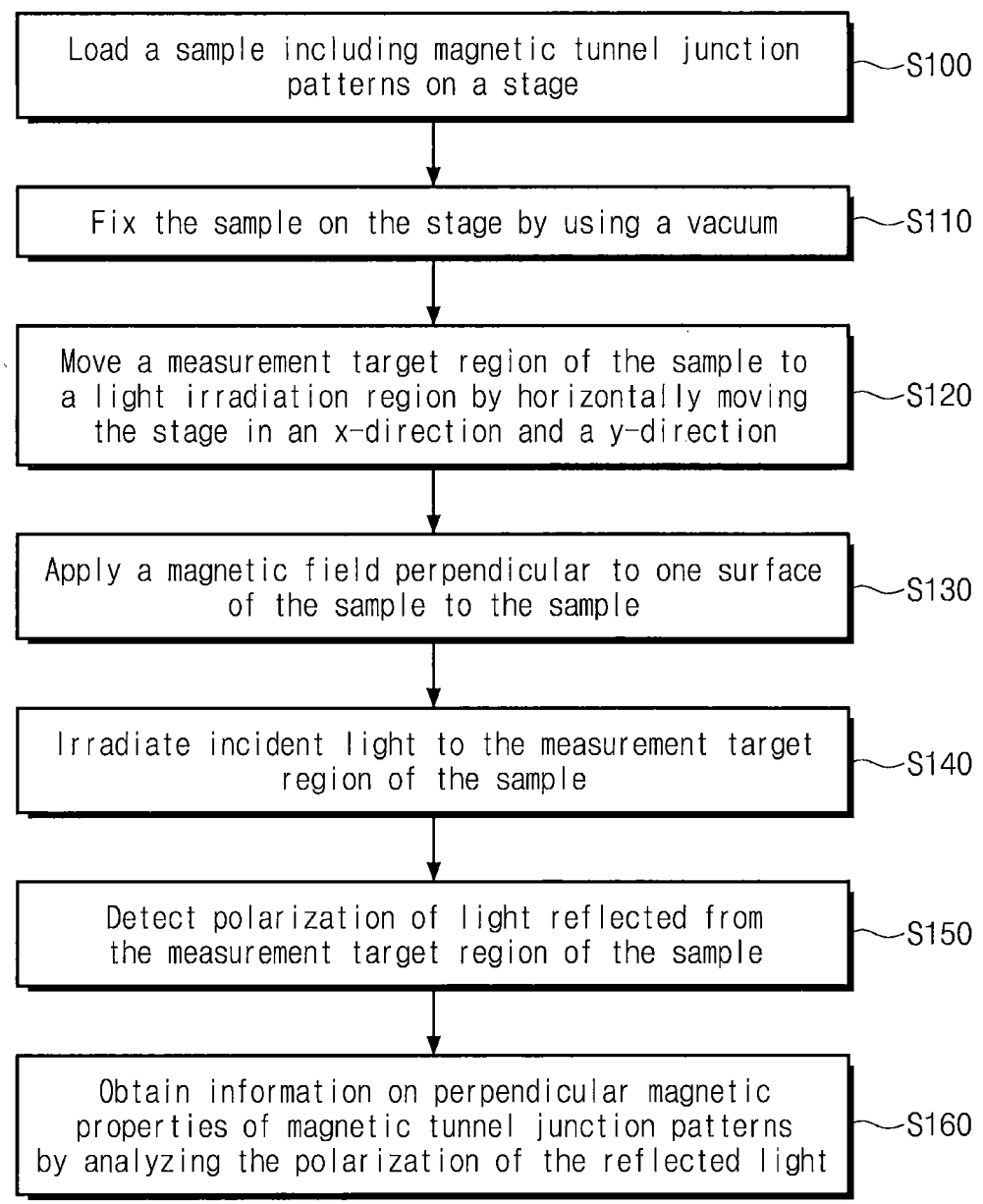
FIG. 10 is a flowchart illustrating a method for measuring magnetic properties, according to some embodiments of the inventive concepts.
Figure 11:
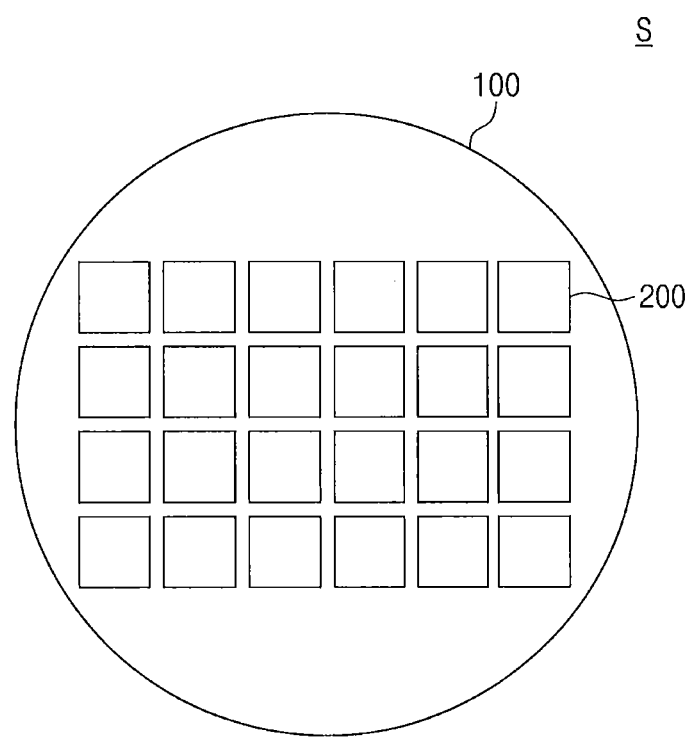
FIG. 11 is a plan view illustrating a sample used in a method for measuring magnetic properties, according to some embodiments of the inventive concepts.
Figure 12:
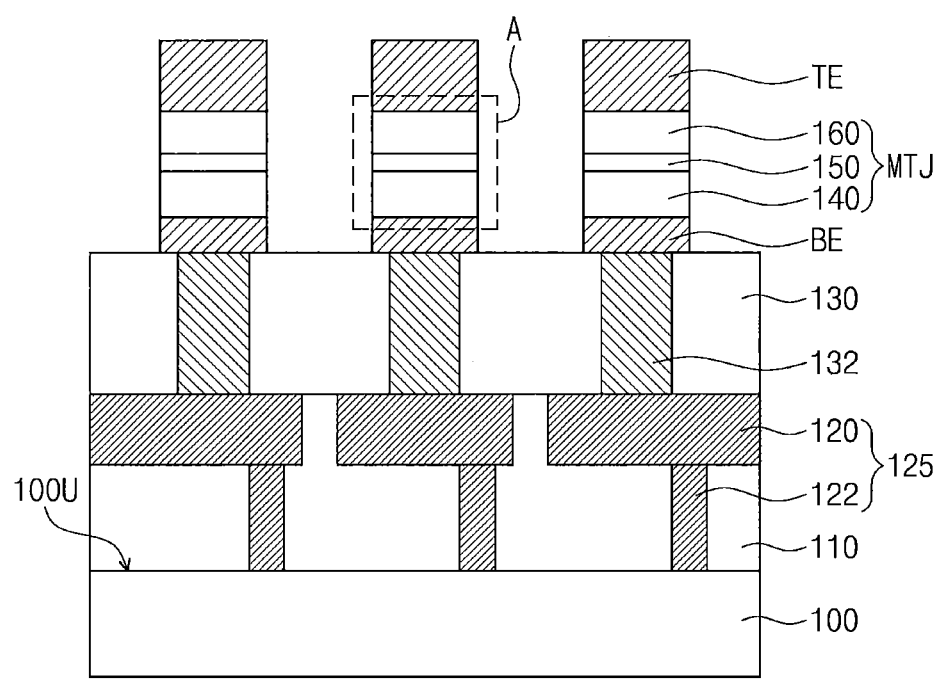
FIG. 12 is a cross-sectional view of a region of the sample of FIG. 11.
Figure 13:
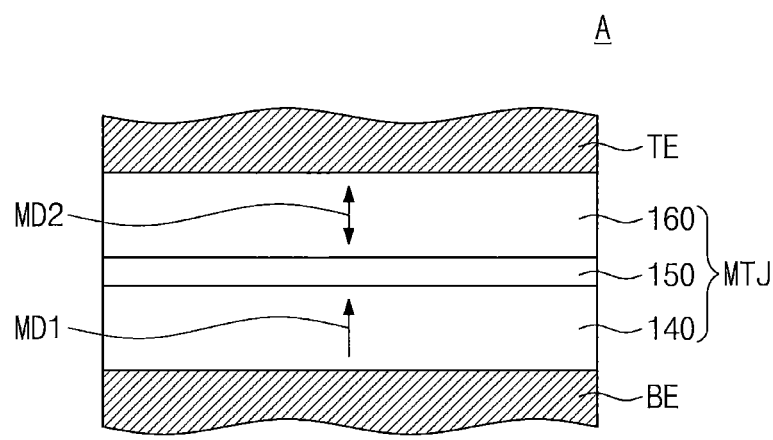
FIG. 13 is an enlarged view of a portion 'A' of FIG. 12.
Figure 14:
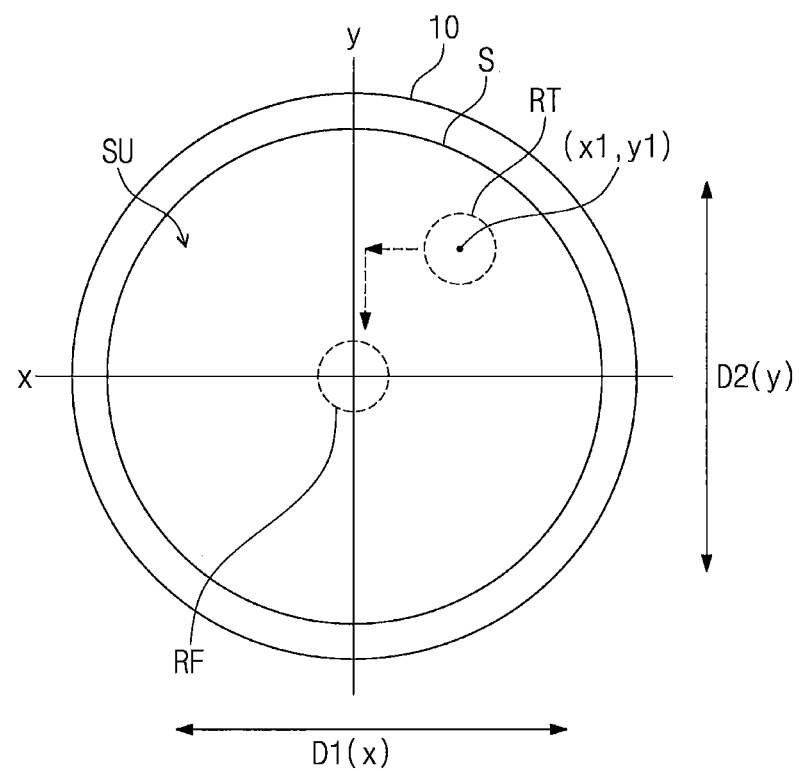
FIGS. 14 and 15 are a plan view and a cross-sectional view, respectively, to explain a method for measuring magnetic properties, according to some embodiments of the inventive concepts.
Figure 15:
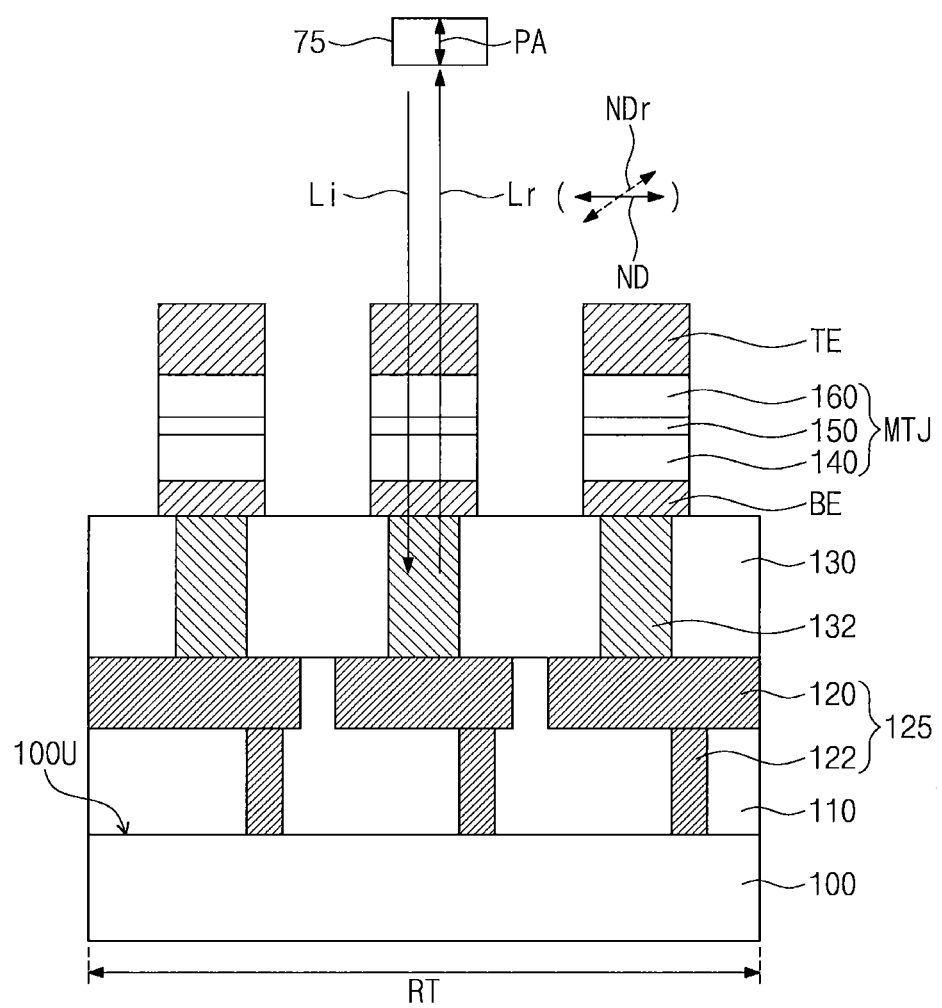

FIG. 10 is a flowchart illustrating a method for measuring magnetic properties, according to some embodiments of the inventive concepts. FIG. 11 is a plan view illustrating a sample used in a method for measuring magnetic properties, according to some embodiments of the inventive concepts. FIG. 12 is a cross-sectional view of a region of the sample of FIG. 11, and FIG. 13 is an enlarged view of a portion 'A' of FIG. 12. FIGS. 14 and 15 are a plan view and a cross-sectional view, respectively, to explain a method for measuring magnetic properties, according to some embodiments of the inventive concepts. Hereinafter, a method for measuring magnetic properties according to some embodiments of the inventive concepts will be described with reference to the magnetic property measuring system 1000 of FIG. 1 for the purpose of ease and convenience in explanation.

Referring to FIGS. 1, 10 and 11, a sample S including magnetic tunnel junction patterns may be loaded on the stage 10 of the magnetic property measuring system 1000 of FIG. 1 (or FIG. 6) (S100). The sample S may include a substrate 100 including a plurality of chip regions 200. The substrate 100 may be a semiconductor substrate that includes silicon, silicon on an insulator (SOI), silicon-germanium (SiGe), germanium (Ge), or gallium-arsenic (GaAs). Each of the chip regions 200 may include a memory region on which memory elements are provided.

Referring to FIGS. 12 and 13, a wiring structure 125 may be provided on each of the chip regions 200 of the substrate 100. The wiring structure 125 may include conductive lines 120 spaced apart from the substrate 100 and contacts 122 connected to the conductive lines 120. The conductive lines 120 may be electrically connected to the substrate 100 through the contacts 122. The conductive lines 120 and the contacts 122 may include a metal material. For example, the conductive lines 120 and the contacts 122 may include copper (Cu). A first interlayer insulating layer 110 may be provided on each of the chip regions 200 of the substrate 100 to cover or surround the wiring structure 125. The first interlayer insulating layer 110 may include at least one of an oxide layer, a nitride layer, or an oxynitride layer.

A second interlayer insulating layer 130 may be provided on the first interlayer insulating layer 110, and bottom electrode contacts 132 may be provided in the second interlayer insulating layer 130. Each of the bottom electrode contacts 132 may penetrate the second interlayer insulating layer 130 so as to be connected to a corresponding one of the conductive lines 120. The second interlayer insulating layer 130 may include at least one of an oxide layer, a nitride layer, or an oxynitride layer, and the bottom electrode contacts 132 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

Magnetic tunnel junction patterns MTJ may be provided on the second interlayer insulating layer 130. The magnetic tunnel junction patterns MTJ may be laterally spaced apart from each other on each of the chip regions 200 of the substrate 100. In other words, the magnetic tunnel junction patterns MTJ may be spaced apart from each other in a direction parallel to a top or upper surface 100U of the substrate 100. The magnetic tunnel junction patterns MTJ may be connected to the bottom electrode contacts 132, respectively. A bottom electrode BE may be provided between each of the magnetic tunnel junction patterns MTJ and each of the bottom electrode contacts 132. A top electrode TE may be provided on each of the magnetic tunnel junction patterns MTJ and may be spaced apart from the bottom electrode BE with each of the magnetic tunnel junction patterns MTJ interposed therebetween. The bottom electrode BE and the top electrode TE may include a conductive material. For example, the bottom electrode BE and the top electrode TE may include a conductive metal nitride (e.g., titanium nitride or tantalum nitride).

Each of the magnetic tunnel junction patterns MTJ may include a first magnetic pattern 140, a second magnetic pattern 160, and a tunnel barrier pattern 150 disposed between the first and second magnetic patterns 140 and 160. One of the first and second magnetic patterns 140 and 160 may be a reference layer of which a magnetization direction is fixed in one direction, and the other of the first and second magnetic patterns 140 and 160 may be a free layer of which a magnetization direction is switchable between stable magnetic states. Magnetization directions MD1 and MD2 of the first and second magnetic patterns 140 and 160 may be substantially perpendicular to an interface between the first magnetic pattern 140 and the tunnel barrier pattern 150. The magnetization directions MD1 and MD2 of the first and second magnetic patterns 140 and 160 may be substantially perpendicular to the top surface 100U of the substrate 100. FIG. 13 illustrates an embodiment in which the first magnetic pattern 140 is the reference layer having the magnetization direction MD1 fixed in one direction and the second magnetic pattern 160 is the free layer having the changeable magnetization direction MD2. However, embodiments of the inventive concepts are not limited thereto. In certain embodiments, unlike FIG. 13, the first magnetic pattern 140 may be the free layer having the changeable magnetization direction, and the second magnetic pattern 160 may be the reference layer having the magnetization direction fixed in one direction.

Each of the first and second magnetic patterns 140 and 160 may include at least one of an intrinsic perpendicular magnetic material or an extrinsic perpendicular magnetic material. The intrinsic perpendicular magnetic material may include a material that has a perpendicular magnetization property even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. The extrinsic perpendicular magnetic material may include a material that has an intrinsic horizontal magnetization property but has a perpendicular magnetization property by an external factor. For example, the extrinsic perpendicular magnetic material may have the perpendicular magnetization property by magnetic anisotropy induced by a junction of the tunnel barrier pattern 150 and the first magnetic pattern 140 (or the second magnetic pattern 160). The extrinsic perpendicular magnetic material may include, for example, CoFeB. The tunnel barrier pattern 150 may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN).

The sample S may include the substrate 100 and the magnetic tunnel junction patterns MTJ provided on the substrate 100. The magnetic tunnel junction patterns MTJ may be perpendicular magnetic tunnel junction patterns in which the first and second magnetic patterns 140 and 160 have the magnetization directions MD1 and MD2 perpendicular to a plane (e.g., the interface between the first magnetic pattern 140 and the tunnel barrier pattern 150). The magnetic property measuring system 1000 of FIG. 1 (or FIG. 6) may be the polar MOKE measuring system and may be used to measure perpendicular magnetic properties of the perpendicular magnetic tunnel junction patterns MTJ.

Referring to FIGS. 1, 10 and 14, the sample S including the magnetic tunnel junction patterns MTJ may be loaded on the stage 10 (S100). The sample S may be fixed on the stage 10 by a vacuum (S110). The stage 10 may fix the sample S on a surface of the stage 10 by drawing or sucking air through the plurality of holes PH.

A measurement target region RT of the sample S may be moved to a light irradiation region RF by horizontally moving the stage 10 in the first direction D1 (e.g., the x-direction) and/or the second direction D2 (e.g., the y-direction) which are parallel to the top surface SU of the sample S (S120). The light irradiation region RF may be a predetermined region in the chamber 500, to which the incident light Li is irradiated. The measurement target region RT may be a specific region of the top surface SU of the sample S. For example, the center of the top surface SU of the sample S may correspond to the origin of an x-y coordinate system, and the measurement target region RT of the top surface SU of the sample S may be expressed by a coordinate value of (x1, y1). In FIG. 14, the x-y coordinate system is illustrated on the top surface SU of the sample S. However, this is provided only to aid understanding of embodiments and is not intended to limit the inventive concepts. In an initial state, the light irradiation region RF may overlap with the center of the top surface SU of the sample S. In this case, the stage 10 may be moved by a distance of (−x1, −y1), and thus the measurement target region RT may be moved to overlap or align with the light irradiation region RF.

Referring to FIGS. 1, 10 and 15, the magnetic field H perpendicular to one surface of the sample S may be applied to the sample S (S130). The magnetic field H may be perpendicular to the top surface SU of the sample S, and the top surface SU of the sample S may correspond to the top surface 100U of the substrate 100. In other words, the magnetic field H may be applied perpendicularly to the top surface 100U of the substrate 100, and thus the first and second magnetic patterns 140 and 160 may have magnetization directions substantially perpendicular to the top surface 100U of the substrate 100. In other words, the magnetic tunnel junction patterns MTJ may have perpendicular magnetic properties.

Since the measurement target region RT overlaps with the light irradiation region RF, the incident light Li may be irradiated to the measurement target region RT of the sample S (S140). The incident light Li may be irradiated to be substantially perpendicular to the top surface 100U of the substrate 100. However, embodiments of the inventive concepts are not limited thereto. In certain embodiments, the incident light Li may be irradiated obliquely to the top surface 100U of the substrate 100, unlike FIG. 15. The incident light Li may be polarized by the polarizer 55 and then may be irradiated to the measurement target region RT.

Polarization of the reflected light Lr reflected from the measurement target region RT of the sample S may be detected (S150). The reflected light Lr may be polarized by the analyzer 75 and may be received to the detector 70 through the analyzer 75. The detector 70 may detect the polarization of the reflected light Lr.

The reflected light Lr may include signal polarized light reflected from the magnetic tunnel junction patterns MTJ, and noise polarized light reflected from lower patterns (e.g., the conductive lines 120) under the magnetic tunnel junction patterns MTJ. For example, the conductive lines 120 may extend in a direction parallel to the top surface 100U of the substrate 100, and a polarization direction ND of the noise polarized light may be substantially parallel to the direction in which the conductive lines 120 extend. The polarization direction ND of the noise polarized light may be substantially perpendicular to a polarization axis PA of the analyzer 75. Thus, the noise polarized light in the reflected light Lr may be blocked by the analyzer 75, and the signal polarized light in the reflected light Lr may pass through the analyzer 75 and then may be received to the detector 70.

If the stage 10 is rotated, the sample S may be rotated about a rotation axis which is parallel to a normal line perpendicular to the top surface SU of the sample S (e.g., the top surface 100U of the substrate 100). In this case, a polarization direction NDr of the noise polarized light may be oblique to the polarization axis PA of the analyzer 75. Thus, at least a portion of the noise polarized light may pass through the analyzer 75 and then may be received to the detector 70. Therefore, noise of the magnetic property measuring system 1000 may be increased. In other words, it may be difficult to measure effective magnetic properties of the magnetic tunnel junction patterns MTJ.

However, according to the embodiments of the inventive concepts, the stage 10 may be an X-Y stage that is configured to be horizontally moved in the first direction D1 (e.g., the x-direction) and the second direction D2 (e.g., the y-direction) which are parallel to the top surface SU of the sample S. In this case, rotation of the stage 10 may not be required to move the measurement target region RT of the sample S to the light irradiation region RF. Thus, the polarization direction ND of the noise polarized light reflected from the measurement target region RT of the sample S may be substantially perpendicular to the polarization axis PA of the analyzer 75. As a result, the noise polarized light in the reflected light Lr may be blocked by the analyzer 75, and thus noise of the magnetic property measuring system 1000 may be reduced to easily measure effective magnetic properties of the magnetic tunnel junction patterns MTJ. In other words, since the stage 10 is the X-Y stage, the effective magnetic properties of the magnetic tunnel junction patterns MTJ may be measured on various regions of the sample S.

In addition, the stage 10 may be configured to fix the sample S on the stage 10 by using a vacuum. Thus, magnetic properties of the magnetic tunnel junction patterns MTJ in the sample S may be stably measured despite the movement of the stage 10.

Information on perpendicular magnetic properties of the magnetic tunnel junction patterns MTJ may be obtained by analyzing the polarization of the reflected light Lr (S160). For example, the obtaining of the information on the perpendicular magnetic properties of the magnetic tunnel junction patterns MTJ may include generating magnetic hysteresis curves of the magnetic tunnel junction patterns MTJ. The information on the perpendicular magnetic properties of the magnetic tunnel junction patterns MTJ may be obtained through the magnetic hysteresis curves. For example, the information on the perpendicular magnetic properties of the magnetic tunnel junction patterns MTJ may include an exchange magnetic field (Hex), a coercive force (Hc), and/or dispersion of coercive forces (Hc) of the magnetic tunnel junction patterns MTJ in a unit chip.

Figure 16:
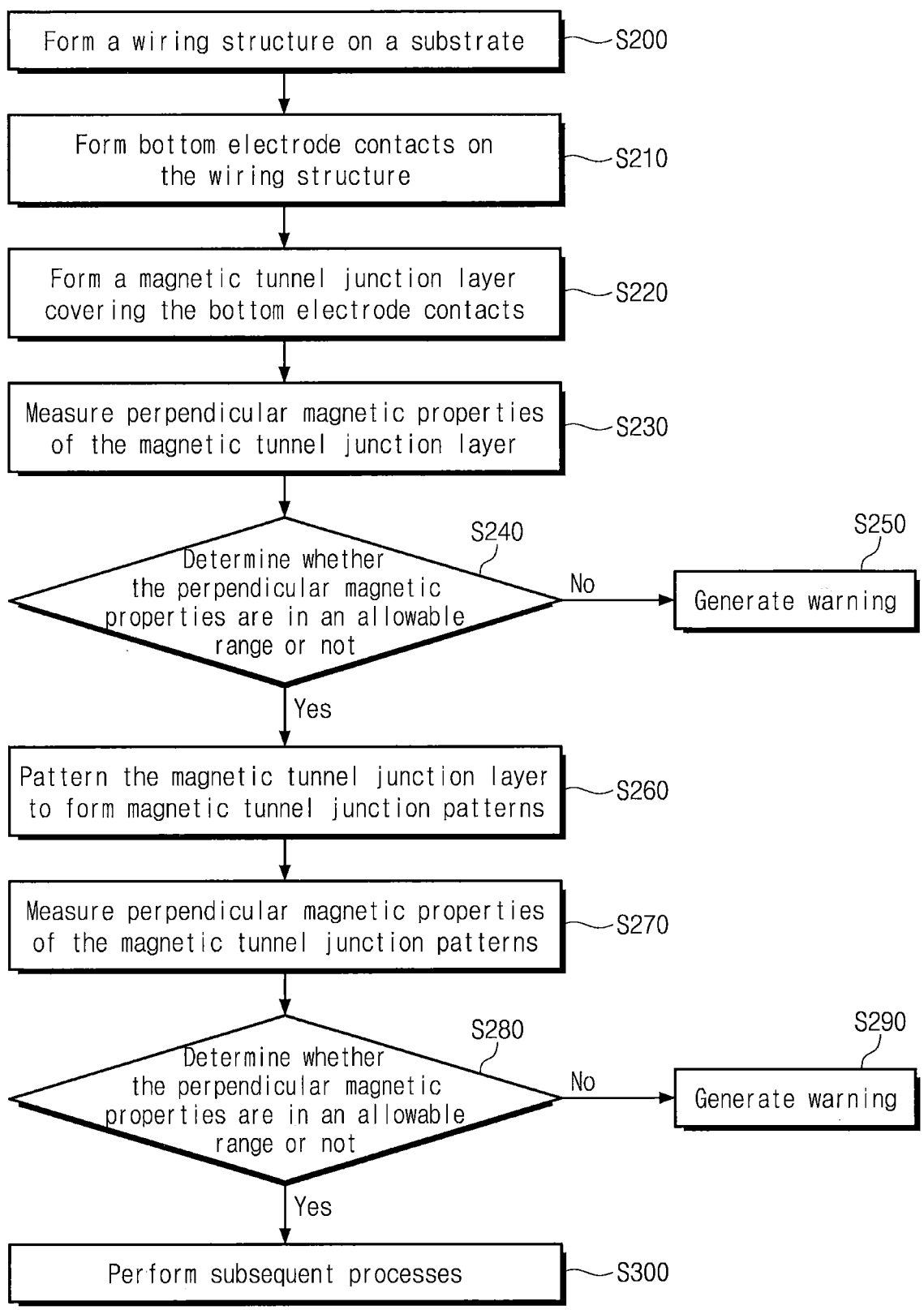
FIG. 16 is a flowchart illustrating a method for manufacturing a magnetic memory device using a magnetic property measuring system according to some embodiments of the inventive concepts.
Figure 17:
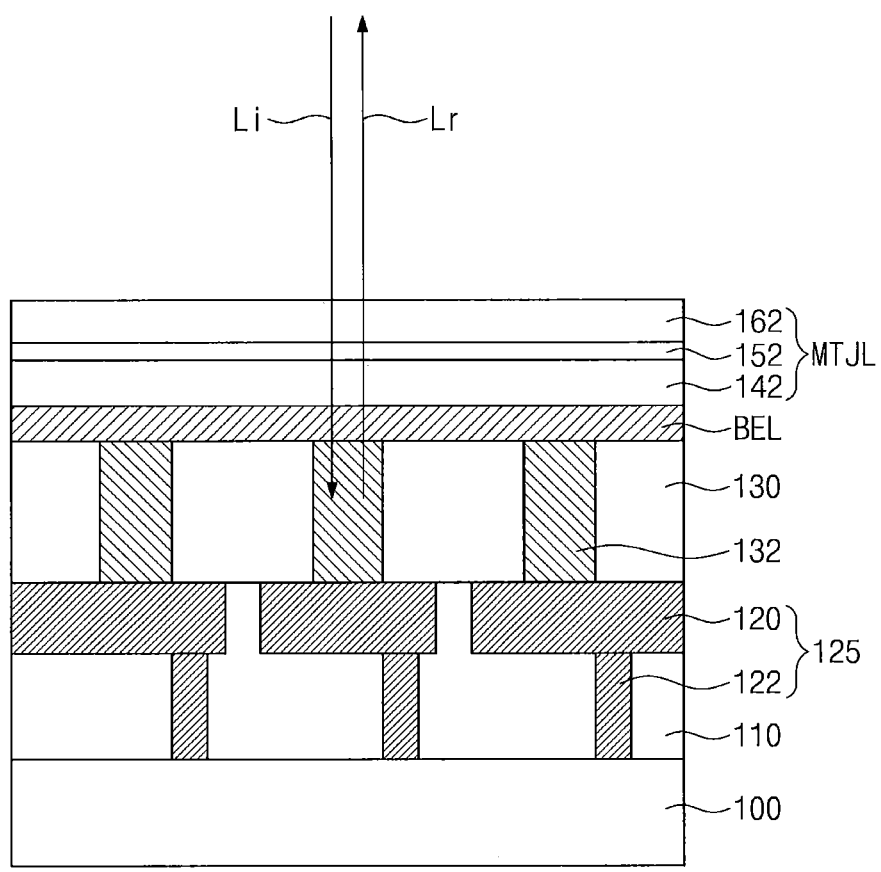
FIGS. 17 to 19 are cross-sectional views illustrating a method for manufacturing a magnetic memory device using a magnetic property measuring system according to some embodiments of the inventive concepts.
Figure 18:
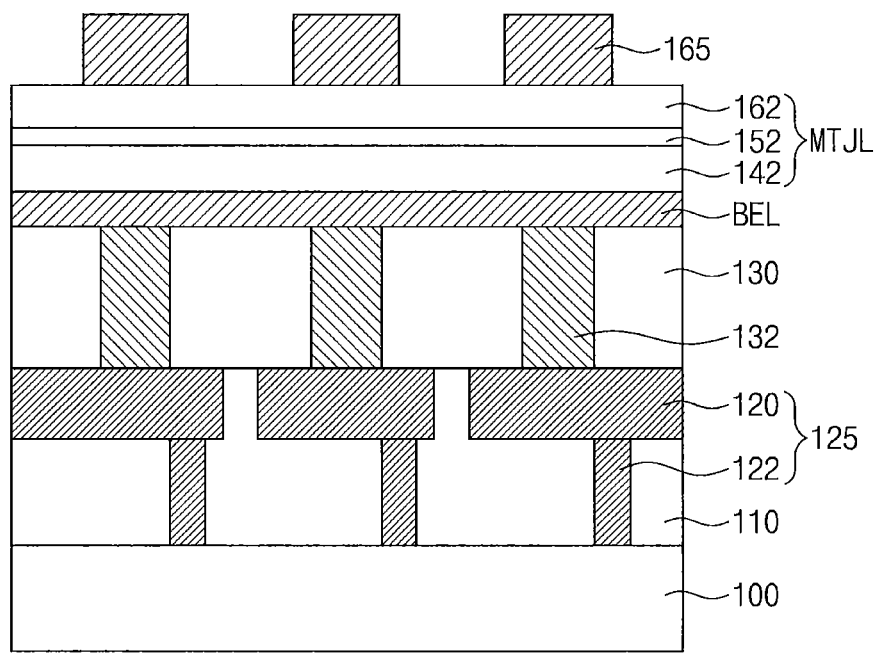
Figure 19:
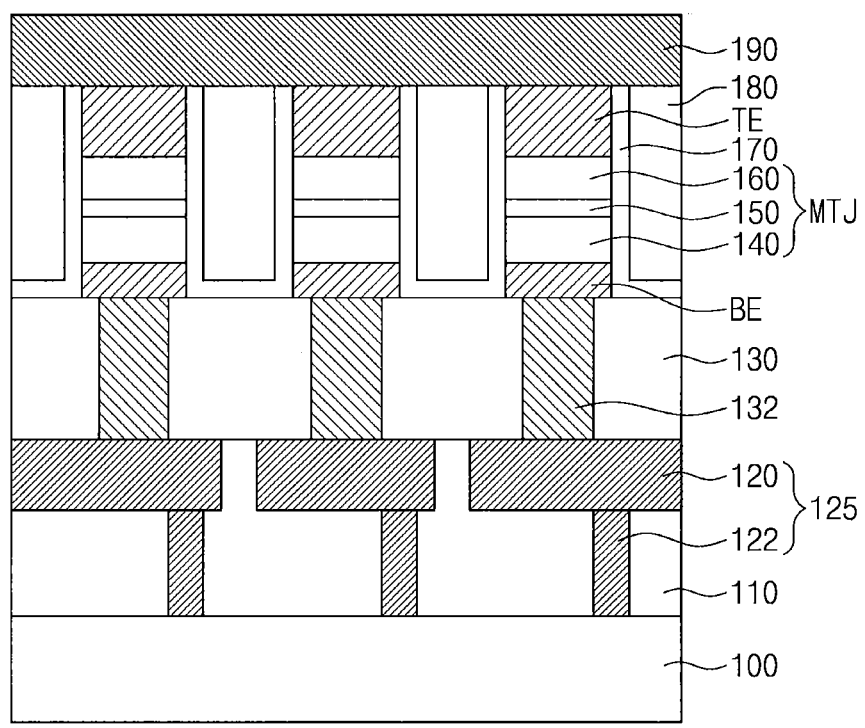

FIG. 16 is a flowchart illustrating a method for manufacturing a magnetic memory device using a magnetic property measuring system according to some embodiments of the inventive concepts. FIGS. 17 to 19 are cross-sectional views illustrating a method for manufacturing a magnetic memory device using a magnetic property measuring system according to some embodiments of the inventive concepts.

Referring to FIGS. 16 and 17, selection elements may be formed on a substrate 100. The substrate 100 may be a semiconductor substrate that includes silicon, silicon on an insulator (SOI), silicon-germanium (SiGe), germanium (Ge), or gallium-arsenic (GaAs). The selection elements may be field effect transistors or diodes. Thereafter, a wiring structure 125 may be formed on the substrate 100 (S200). The wiring structure 125 may be electrically connected to the substrate 100. The wiring structure 125 may include conductive lines 120 spaced apart from the substrate 100, and contacts 122 connected to the conductive lines 120. The conductive lines 120 may be electrically connected to the substrate 100 through the contacts 122. At least one of the conductive lines 120 may be electrically connected to one terminal of a corresponding selection element through a corresponding contact 122. The conductive lines 120 and the contacts 122 may include a metal material. For example, the conductive lines 120 and the contacts 122 may include copper (Cu). A first interlayer insulating layer 110 may be formed on the substrate 100 to cover or surround the selection elements and the wiring structure 125. The first interlayer insulating layer 110 may be formed of a single layer or multi-layer including at least one of an oxide layer, a nitride layer, or an oxynitride layer.

Bottom electrode contacts 132 may be formed on the wiring structure 125 (S210). Each of the bottom electrode contacts 132 may be electrically connected to one terminal of a corresponding selection element through a corresponding conductive line 120. The bottom electrode contacts 132 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide). A second interlayer insulating layer 130 may be formed on the first interlayer insulating layer 110 and may cover or surround the bottom electrode contacts 132. The second interlayer insulating layer 130 may be formed of a single layer or multi-layer including at least one of an oxide layer, a nitride layer, or an oxynitride layer.

A bottom electrode layer BEL and a magnetic tunnel junction layer MTJL, which cover the bottom electrode contacts 132, may be formed on the second interlayer insulating layer 130 (S220). The bottom electrode layer BEL may be disposed between the second interlayer insulating layer 130 and the magnetic tunnel junction layer MTJL. For example, the bottom electrode layer BEL may include a conductive metal nitride (e.g., titanium nitride or tantalum nitride). The magnetic tunnel junction layer MTJL may include a first magnetic layer 142, a tunnel barrier layer 152 and a second magnetic layer 162, which are sequentially stacked on the bottom electrode layer BEL. Each of the first and second magnetic layers 142 and 162 may include at least one of the intrinsic perpendicular magnetic material or the extrinsic perpendicular magnetic material, described above. The tunnel barrier layer 152 may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN).

Perpendicular magnetic properties of the magnetic tunnel junction layer MTJL may be measured (S230). The perpendicular magnetic properties of the magnetic tunnel junction layer MTJL may be measured using the magnetic property measuring system 1000 of FIG. 1 (or FIG. 6).

In detail, the sample S including the substrate 100 having the magnetic tunnel junction layer MTJL may be prepared. As described with reference to FIGS. 1 and 10, the sample S may be loaded on the stage 10 of the magnetic property measuring system 1000 of FIG. 1 or 6 (S100), and the sample S may be fixed on the stage 10 by a vacuum (S110). The measurement target region RT of the sample S may be moved to the light irradiation region RF by horizontally moving the stage 10 in the first direction D1 (e.g., the x-direction) and/or the second direction D2 (e.g., the y-direction) which are parallel to the top surface SU of the sample S (S120). The magnetic field H perpendicular to the top surface SU of the sample S may be applied to the sample S (S130). The incident light Li may be irradiated to the measurement target region RT of the sample S (S140), and polarization of the reflected light Lr reflected from the measurement target region RT of the sample S may be detected (S150). Information on the perpendicular magnetic properties of the magnetic tunnel junction layer MTJL may be obtained by analyzing the polarization of the reflected light Lr (S160). The obtaining of the information on the perpendicular magnetic properties of the magnetic tunnel junction layer MTJL may include generating a magnetic hysteresis curve of the magnetic tunnel junction layer MTJL. The information on the perpendicular magnetic properties of the magnetic tunnel junction layer MTJL may be obtained through the magnetic hysteresis curve. For example, the information on the perpendicular magnetic properties of the magnetic tunnel junction layer MTJL may include an exchange magnetic field (Hex), a coercive force (Hc), and/or dispersion of the coercive force (Hc) of the magnetic tunnel junction layer MTJL in a unit chip.

Referring to FIGS. 16 and 18, it may be determined whether the measured perpendicular magnetic properties of the magnetic tunnel junction layer MTJL are in an allowable range or not (S240). When the measured perpendicular magnetic properties are outside the allowable range, a warning may be generated (S250). When the measured perpendicular magnetic properties are in the allowable range, conductive mask patterns 165 may be formed on the magnetic tunnel junction layer MTJL. The conductive mask patterns 165 may define regions in which magnetic tunnel junction patterns will be formed. For example, the conductive mask patterns 165 may include a conductive metal nitride (e.g., titanium nitride or tantalum nitride).

Referring to FIGS. 15 and 16, the magnetic tunnel junction layer MTJL and the bottom electrode layer BEL may be sequentially patterned using the conductive mask patterns 165 as etch masks to form magnetic tunnel junction patterns MTJ and bottom electrodes BE (S260). The conductive mask patterns 165 may function as top electrodes TE, respectively. Each of the magnetic tunnel junction patterns MTJ may include a first magnetic pattern 140, a tunnel barrier pattern 150 and a second magnetic pattern 160, which are sequentially stacked on each of the bottom electrodes BE. The magnetic tunnel junction patterns MTJ may be spaced apart from each other in a direction parallel to the top surface 100U of the substrate 100, and the bottom electrodes BE may be provided under the magnetic tunnel junction patterns MTJ, respectively.

Perpendicular magnetic properties of the magnetic tunnel junction patterns MTJ may be measured (S270). The perpendicular magnetic properties of the magnetic tunnel junction patterns MTJ may be measured using the magnetic property measuring system 1000 of FIG. 1 (or FIG. 6).

In detail, the sample S including the substrate 100 having the magnetic tunnel junction patterns MTJ may be prepared. As described with reference to FIGS. 1 and 10, the sample S may be loaded on the stage 10 of the magnetic property measuring system 1000 of FIG. 1 or 6 (S100), and the sample S may be fixed on the stage 10 by a vacuum (S110). The measurement target region RT of the sample S may be moved to the light irradiation region RF by horizontally moving the stage 10 in the first direction D1 (e.g., the x-direction) and/or the second direction D2 (e.g., the y-direction) which are parallel to the top surface SU of the sample S (S120). The magnetic field H perpendicular to the top surface SU of the sample S may be applied to the sample S (S130). The incident light Li may be irradiated to the measurement target region RT of the sample S (S140), and polarization of the reflected light Lr reflected from the measurement target region RT of the sample S may be detected (S150). Information on the perpendicular magnetic properties of the magnetic tunnel junction patterns MTJ may be obtained by analyzing the polarization of the reflected light Lr (S160). The obtaining of the information on the perpendicular magnetic properties of the magnetic tunnel junction patterns MTJ may include generating magnetic hysteresis curves of the magnetic tunnel junction patterns MTJ. The information on the perpendicular magnetic properties of the magnetic tunnel junction patterns MTJ may be obtained through the magnetic hysteresis curves. For example, the information on the perpendicular magnetic properties of the magnetic tunnel junction patterns MTJ may include an exchange magnetic field (Hex), a coercive force (Hc), and/or dispersion of coercive forces (Hc) of the magnetic tunnel junction patterns MTJ in a unit chip.

Referring to FIGS. 16 and 19, it may be determined whether the measured perpendicular magnetic properties of the magnetic tunnel junction patterns MTJ are in an allowable range or not (S280). When the measured perpendicular magnetic properties are outside the allowable range, a warning may be generated (S290). When the measured perpendicular magnetic properties are in the allowable range, subsequent processes may be performed (S300). In detail, a protective layer 170 may be formed on the second interlayer insulating layer 130 and may cover or surround sidewalls of the magnetic tunnel junction patterns MTJ and sidewalls of the bottom electrodes BE. The protective layer 170 may also cover or surround sidewalls of the top electrodes TE. The protective layer 170 may include, for example, silicon nitride. A third interlayer insulating layer 180 may be formed on the second interlayer insulating layer 130 and may cover or surround the magnetic tunnel junction patterns MTJ, the bottom electrodes BE, and the top electrodes TE. The protective layer 170 may be disposed between the third interlayer insulating layer 180 and each of the magnetic tunnel junction patterns MTJ, between the third interlayer insulating layer 180 and each of the bottom electrodes BE, and between the third interlayer insulating layer 180 and each of the top electrodes TE. In addition, the protective layer 170 may extend between the third interlayer insulating layer 180 and a top surface of the second interlayer insulating layer 130 disposed between the magnetic tunnel junction patterns MTJ. The third interlayer insulating layer 180 may be formed to fill a space between the magnetic tunnel junction patterns MTJ. The third interlayer insulating layer 180 may include at least one of an oxide layer, a nitride layer, or an oxynitride layer. Bit lines 190 may be formed on the third interlayer insulating layer 180. Each of the magnetic tunnel junction patterns MTJ may be connected to a corresponding one of the bit lines 190. The bit lines 190 may include at least one of a metal (e.g., titanium, tantalum, copper, aluminum, or tungsten) or a conductive metal nitride (e.g., titanium nitride or tantalum nitride).

Figure 20:
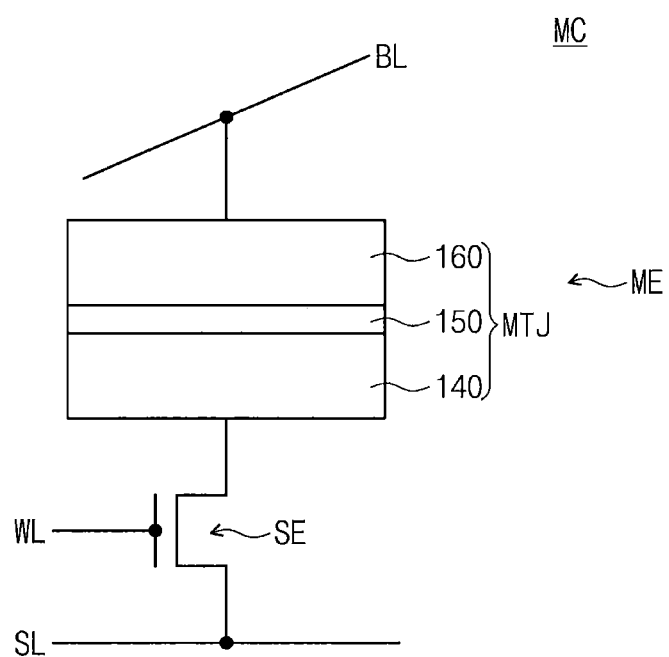
FIG. 20 is a circuit diagram illustrating a unit memory cell of a magnetic memory device manufactured according to some embodiments of the inventive concepts.

FIG. 20 is a circuit diagram illustrating a unit memory cell of a magnetic memory device manufactured according to some embodiments of the inventive concepts.

Referring to FIG. 20, a unit memory cell MC may include a memory element ME and a selection element SE, which are connected in series to each other. The memory element ME may be connected between a bit line BL and the selection element SE. The selection element SE may be connected between the memory element ME and a source line SL and may be controlled by a word line WL. The memory element ME may include the magnetic tunnel junction pattern MTJ which includes the first and second magnetic patterns 140 and 160 and the tunnel barrier pattern 150 disposed between the first and second magnetic patterns 140 and 160. One of the first and second magnetic patterns 140 and 160 may be a reference layer which has a magnetization direction fixed regardless of an external magnetic field in a use environment, and the other of the first and second magnetic patterns 140 and 160 may be a free layer of which a magnetization direction is changeable by an external magnetic field or spin torque of electrons in a program current. An electrical resistance of the magnetic tunnel junction pattern MTJ when the magnetization directions of the reference layer and the free layer are anti-parallel or not parallel to each other may be much greater than that of the magnetic tunnel junction pattern MTJ when the magnetization directions of the reference layer and the free layer are parallel to each other. In other words, the electrical resistance of the magnetic tunnel junction pattern MTJ may be adjusted by changing the magnetization direction of the free layer. Thus, logical data may be stored in the memory element ME of the unit memory cell MC by using an electrical resistance difference according to the magnetization directions of the reference layer and the free layer.

According to the embodiments of the inventive concepts, the stage 10 may be configured as the X-Y stage, and thus the effective magnetic properties of the magnetic tunnel junction patterns MTJ may be measured on various regions of the sample S. The stage 10 may be configured to fix the sample S on the stage 10 by using a vacuum. Thus, magnetic properties of the magnetic tunnel junction patterns MTJ in the sample S may be stably measured despite the movement of the stage 10.

In addition, the magnetic properties of the magnetic tunnel junction patterns MTJ may be advantageously monitored using the magnetic property measuring system 1000 in the processes of manufacturing the magnetic memory device. Thus, it is possible to provide the method for manufacturing the magnetic memory device, which can improve mass production and quality stability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A system comprising:
a stage configured to hold a sample, and including a body, a magnetic portion contacting the body and a plurality of holes disposed in at least one of the body and the magnetic portion; and
a magnetic structure disposed over the stage,
wherein the magnetic portion of the stage and the magnetic structure are configured to apply a magnetic field to the sample, and
the stage is configured to move in a first direction and in a second direction.

2. The system of claim 1, wherein each of the first direction and the second direction is substantially parallel to a top surface of the sample.

3. The system of claim 1, wherein the first direction is substantially perpendicular to the second direction.

4. The system of claim 1, wherein the magnetic field is configured to be applied substantially perpendicularly to a top surface of the sample.

5. The system of claim 1, further comprising:
a chamber configured to receive the sample;
a support member configured to support the stage;
a light source configured to emit incident light; and
a detector configured to receive reflected light that is reflected from the sample.

6. The system of claim 5, further comprising:
a polarizer configured to polarize the incident light that is emitted from the light source;
an optical member configured to control a light path of the incident light; and
an analyzer configured to polarize the reflected light.

7. The system of claim 1, wherein the magnetic portion of the stage is disposed on the body of the stage.

8. The system of claim 1, wherein each of the plurality of holes is connected to a vacuum line disposed in the body of the stage, and
the stage is configured to fix the sample on the stage by drawing air through the plurality of holes.

9. The system of claim 1, wherein the sample is placed on a top surface of the magnetic portion of the stage.

10. The system of claim 1, wherein the sample is placed on a top surface of the body of the stage.

* * * * *